(12) United States Patent
Byun et al.

(10) Patent No.: US 8,470,519 B2
(45) Date of Patent: Jun. 25, 2013

(54) METHOD FOR REMOVING PHOTORESIST PATTERN

(75) Inventors: Dong-Jin Byun, Seoul (KR); Sam-Seok Jang, Seoul (KR); Bum-Joon Kim, Seoul (KR); Jung-Geun Jhin, Gwangju (KR); Sang-Il Kim, Seoul (KR); Do-Han Lee, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 151 days.

(21) Appl. No.: 13/024,678

(22) Filed: Feb. 10, 2011

(65) Prior Publication Data

US 2011/0200951 A1 Aug. 18, 2011

(30) Foreign Application Priority Data

Feb. 10, 2010 (KR) .................. 10-2010-0012492

(51) Int. Cl.
*G03F 7/36* (2006.01)
(52) U.S. Cl.
USPC .......................................... 430/329; 430/330

(58) Field of Classification Search
USPC ................................................. 430/329, 331
See application file for complete search history.

(56) References Cited

U.S. PATENT DOCUMENTS

| | | | | |
|---|---|---|---|---|
| 6,724,460 B2* | 4/2004 | Van Schaik et al. | ............ | 355/30 |
| 7,116,394 B2* | 10/2006 | Bakker et al. | ................... | 355/30 |
| 2004/0103917 A1* | 6/2004 | Heerens | ............................. | 134/7 |
| 2007/0240740 A1* | 10/2007 | McDermott | .................... | 134/26 |

* cited by examiner

*Primary Examiner* — Kathleen Duda
(74) *Attorney, Agent, or Firm* — Edwards Wildman Palmer LLP

(57) ABSTRACT

Disclosed is a method of removing a photoresist pattern, which includes radiating light onto a substrate having a photoresist pattern formed thereon and implanted with a predetermined dopant so that the temperature of the substrate is increased to be equal to or higher than a temperature able to remove the photoresist pattern, and by which the photoresist pattern formed on the substrate can be almost completely removed using a simple process for radiating light onto the substrate so that the temperature of the substrate is increased to be equal to or higher than a temperature able to the photoresist pattern.

4 Claims, 9 Drawing Sheets

(9 of 9 Drawing Sheet(s) Filed in Color)

METHOD FOR REMOVING PHOTORESIST PATTERN

CROSS REFERENCE TO RELATED APPLICATION

This application claims the benefit of Korean Patent Application No. 10-2010-0012492, filed Feb. 10, 2010, which is hereby incorporated by reference in its entirety into this application.

BACKGROUND OF THE INVENTION

1. Technical Field

The present invention relates to a method of removing a photoresist pattern formed on a substrate.

2. Description of the Related Art

Fabrication of integrated circuits includes a variety of processes. Among these, photolithography which is used to form an integrated circuit pattern is performed using a photoresist. More specifically, photolithography is carried out by coating a semiconductor substrate with a photoresist and then radiating UV light onto the photoresist to thus form a pattern.

The photoresist pattern formed on the substrate in this way is required to be removed after completion of processes related to the pattern. In order to remove the photoresist pattern, a dry cleaning process for removing a photoresist pattern using oxygen plasma is widely available. However, because a variety of processes are performed on the substrate and the photoresist pattern after forming the photoresist pattern, it is not easy to definitely remove the photoresist pattern formed on the substrate even by the conventional process as above.

In particular, in the case where ion implantation for implanting dopant ions in the surface of a substrate having a photoresist pattern formed thereon is performed, removal of the photoresist pattern becomes more difficult. In this case, because the dopant ions may also be implanted in the photoresist pattern, it is not easy to completely remove the photoresist pattern by means of the conventional process using oxygen plasma.

With the goal of solving such problems, a wet cleaning process for removing a photoresist pattern using an organic solvent or an acid compound is being utilized, but is problematic because a harmful chemical is used in a large amount and the disposal cost thereof is high.

SUMMARY OF THE INVENTION

Accordingly, the present invention has been made keeping in mind the above problems encountered in the related art, and an object of the present invention is to provide a method of removing a photoresist pattern, in which a simple process for radiating light onto a substrate having a photoresist pattern formed thereon and implanted with a dopant is performed so that the temperature of the substrate is increased to be equal to or higher than a temperature able to remove the photoresist pattern, thereby completely removing the photoresist pattern formed on the substrate.

Another object of the present invention is to provide a method of removing a photoresist pattern, which is able to remove the photoresist pattern formed on a substrate without the use of a harmful chemical.

In order to accomplish the above objects, the present invention provides a method of removing a photoresist pattern, comprising radiating light onto a substrate having a photoresist pattern formed thereon and implanted with a dopant so that the temperature of the substrate is increased to be equal to or higher than a temperature able to remove the photoresist pattern, thereby removing the photoresist pattern.

According to the present invention, by means of a simple process for radiating light onto the substrate so that the temperature of the substrate is increased to be equal to or higher than the temperature able to remove the photoresist pattern formed on the substrate, the photoresist pattern formed on the substrate may be almost completely removed.

According to the present invention, the photoresist pattern formed on the substrate may be removed without the use of a harmful chemical.

BRIEF DESCRIPTION OF THE DRAWINGS

This patent specification or the file therefor includes one or more color drawings. In the case where there is a proposal along with a predetermined amount of fee, the present patent publication or application publication will be provided together with the color drawings.

DESCRIPTION OF THE PREFERRED EMBODIMENTS

Hereinafter, preferred embodiments of the present invention regarding a method of removing a photoresist pattern will be described in detail while referring to the accompanying drawings. The present description, drawings and illustrative embodiments disclosed in claims are not construed to limit the present invention. Other embodiments may be used and other modifications may be applied, without departing from the spirit or scope of the invention.

Figure 1:
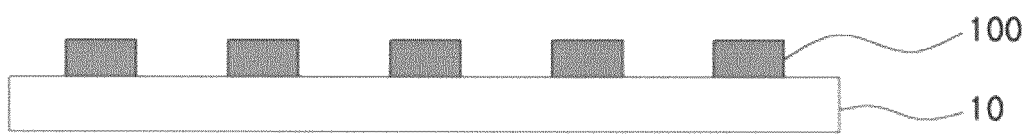
FIG. 1 is a view showing a photoresist pattern formed on a substrate according to an embodiment of the present invention.

FIG. 1 shows a photoresist pattern 100 formed on a substrate 10 according to an embodiment of the present invention.

With reference to FIG. 1, the photoresist pattern 100 is formed on the substrate 10.

Specifically, the kind of substrate 10 used in the present invention is not particularly limited, and various kinds of substrates 10, such as glass, plastic, polymers, silicon wafers, sapphire, stainless steel, etc., may be used. In the present invention, because the photoresist pattern 100 is removed in a state in which the temperature of the substrate is increased to be equal to or higher than a temperature able to remove the photoresist pattern, for example, at a high temperature of 550° C. or more, as will be described later, it is noted that a substrate 10 which is not deformed even at such a high temperature be used.

Also, the photoresist used in the present invention is a photosensitive polymer that is defined as a polymer composition in which the molecular structure thereof chemically changes within a short period of time due to irradiation of light thus causing changes in properties such as solubility in any solvent. The kind of such a photoresist is not particularly limited. Thus, examples of the photoresist according to the present invention may include a variety of photoresists, including a photoresist for i-line, a photoresist for KrF, and a photoresist for ArF, depending on the type of light source, and both negative and positive photoresists may be used. Below, a case where the photoresist according to the present invention is negative is illustratively described.

Forming the photoresist pattern 100 on the substrate 10 is performed as follows.

First, a photoresist film having a predetermined thickness is formed on the substrate 10.

Next, UV light passed through a mask (not shown) for forming a fine pattern is radiated onto the photoresist film, so that the photoresist is selectively photo-exposed. Thereby, the photo-exposed portion of the photoresist film is activated and has changes in solubility properties, and also there occur changes in solubility properties between the photo-exposed portion and the photo-unexposed portion of the photoresist film.

Next, PEB (Post Exposure Bake) for thermally treating the photo-exposed photoresist film at high temperature is performed. This PEB plays a role in promoting a cross-linking reaction so that the photoresist film exposed to UV light does not react with a developer, thus enhancing the resolution of the photoresist pattern 100.

Next, the photoresist film is developed using a known developer, thus removing the portion of the photoresist film which is not exposed to UV light, resulting in the photoresist pattern 100 as shown in FIG. 1.

During the above procedure, PEB is advantageous because of enhancing the resolution of the photoresist pattern 100 as mentioned above, but may cause physical and chemical changes of the photoresist pattern 100, undesirably making it difficult to subsequently remove the photoresist pattern 100. Accordingly, there is a difficulty in which a worker who performs photolithography should adjust the degree of thermal treatment upon PEB, or should omit PEB as needed.

However, in the present invention, because the photoresist pattern 100 can be almost completely removed from the substrate 10 using only simple light irradiation which will be described later, a worker can perform safely PEE, and also, the resolution of the photoresist pattern 100 can be further enhanced.

The case where the photoresist pattern 100 is formed on the substrate 10 is described herein, but the present invention is not necessarily limited thereto. Thus, it should also be understood that forming the photoresist pattern 100 on any semiconductor, layer be incorporated in the scope of the present invention.

Next, although not shown in FIG. 1, the substrate 10 having the photoresist pattern 100 formed thereon may be subjected to a variety of semiconductor processes. Such semiconductor processes may include etching in which the exposed portion of the substrate 10 is selectively etched using the photoresist pattern 100 as an etching mask, the ion implantation as above, etc. Below, a case where the substrate having the photoresist pattern 100 formed thereon is subjected to ion implantation is briefly described.

In order to change the properties of the substrate 10, ion implantation for implanting dopant ions in the surface of the substrate 10 having the photoresist pattern 100 formed thereon is carried out. In this case, because the implantation of dopant ions is blocked at the portion of the substrate on which the photoresist pattern 100 is formed, the dopant ions may be selectively implanted in the surface of the substrate 10. The dopant ions implanted in the substrate 10 may be a material for imparting n- or p-type semiconductor properties to the substrate 10, and such dopant ions may have a high concentration ranging from about $10^{16}$ to about $10^{18}/cm^2$.

Examples of the dopant used in the present invention include but are not necessarily limited to $Xe^+$, $Ar^+$, $H^+$, $O^+$, $N^+$, etc.

As mentioned above, the dopant ions may also be implanted in the photoresist pattern 100 during the ion implantation. In this case, the photoresist pattern 100 is damaged by the dopant ions having high energy, whereby physical or chemical properties of the photoresist pattern 100 may change. For this reason, after completion of the ion implantation, it is difficult to completely remove the photoresist pattern 100. Furthermore, the degree of implanting the ions in the photoresist pattern 100 increases in proportion to an increase in the concentration of the implanted ions. Hence, in the case where ions having a high concentration are implanted in the substrate 10, it is difficult for a worker to completely remove the photoresist pattern 100 after completion of the ion implantation, undesirably making it impossible to efficiently perform subsequent processes.

However, in the present invention, the photoresist pattern 100 can be almost completely removed from the substrate 10 using only simple light irradiation which will be described below, and thus the aforementioned problems do not occur.

Figure 2:
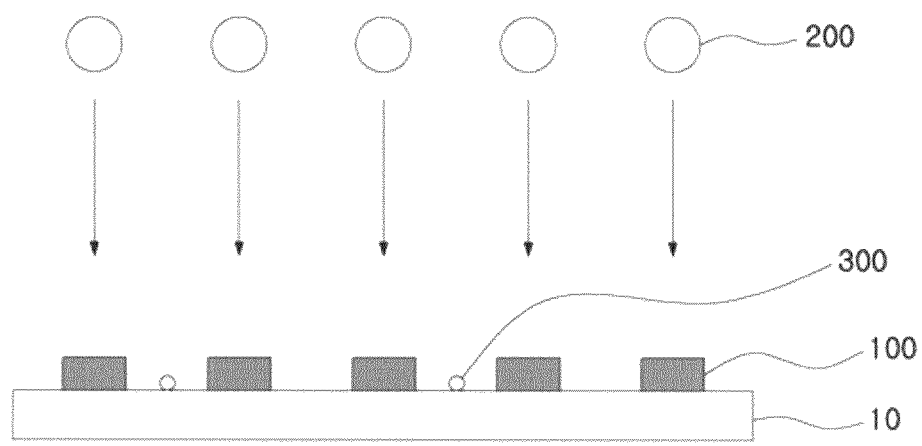
FIG. 2 is a view showing removing the photoresist pattern according to an embodiment of the present invention.

FIG. 2 shows removing the photoresist pattern 100 according to an embodiment of the present invention.

With reference to FIG. 2, light is radiated onto the substrate 10 for a predetermined period of time, so that the temperature of the substrate is increased to be equal to or higher than a temperature able to remove the photoresist pattern formed on the substrate, thereby almost completely removing the photoresist pattern 100 formed on the substrate 10. Specifically, thermal energy of light increases the temperature of the substrate 10 to the level equal to or higher than a temperature at which the photoresist pattern may be removed from the substrate, whereby the photoresist pattern 100 formed on the substrate 10 can be almost completely removed.

The temperature of the substrate after light irradiation, namely, the temperature able to remove the photoresist pattern from the substrate, is preferably set to 550° C. or higher, more preferably 600° C. or higher, and still more preferably 700° C. or higher. There is no upper limit of the temperature available in the present invention under conditions in which the temperature of the substrate is equal to or higher than a temperature able to remove the photoresist pattern formed on the substrate. However, if the temperature of the substrate is excessively increased due to irradiation of light, the substrate may be deformed. Hence, the temperature applicable in the present invention may range from 550° C. to less than the temperature at which no deformation of the substrate occurs. Ultimately, the upper limit of the temperature according to the present invention may vary depending on the type of material of the substrate. For example, in the case of a silicon substrate, the temperature at which the deformation of the substrate occurs is about 1200° C., and in the case of a sapphire substrate, the temperature at which the deformation of the substrate occurs is about 2000° C., and the upper limit of the temperature may be determined depending thereon.

Removing the photoresist pattern 100 may be performed in a chamber (not shown). More specifically, the substrate 10 is seated at a predetermined position inside the chamber which is hermetically sealed, and light is radiated onto the substrate 10 thus removing the photoresist pattern 100. As shown in FIG. 2, the direction at which light is preferably radiated is the direction at which light is directly radiated onto the photoresist pattern 100, namely, the upper surface of the substrate 10.

If the period of time for which light is radiated onto the substrate 10 is too short, the photoresist pattern 100 cannot be almost completely removed. In contrast, if the period of time for which light is radiated onto the substrate 10 is too long, there is a concern about deformation of the substrate 10 itself. Thus, in order to completely remove only the photoresist pattern 100, the period of time for which light is radiated onto the substrate 10 is preferably set in the range from 5 sec to 10 min, and more preferably from 10 sec to 5 min, but the present invention is not necessarily limited thereto.

Also, as light is radiated onto the substrate 10, it is preferred that the temperature of the substrate 10 be rapidly increased so that the photoresist pattern 100 may be removed. More specifically, when light is radiated onto the substrate 10, the temperature of the substrate 10 is rapidly increased to be equal to or higher than a temperature able to remove the photoresist pattern, for example, to 550° C. or higher, after which while this temperature is maintained, light is continuously radiated onto the substrate 10, so that the photoresist pattern 100 formed on the substrate 10 may be removed. Like this, in the case where the temperature of the substrate 10 is rapidly increased due to irradiation of light, the heating rate of the substrate 10 is preferably set to 50 to 150° C./sec, but the present invention is not necessarily limited thereto.

Also, a device for radiating light onto the substrate 10 is preferably any one selected from among a halogen lamp 200 shown in FIG. 2, a tungsten lamp, a quartz tube heater, and a ceramic heater, but the present invention is not necessarily limited thereto. Such a device may be appropriately adopted depending on the end use of the present invention.

During light is radiated onto the substrate 10, the atmosphere around the substrate 10 may be in a vacuum or a predetermined gas atmosphere. Such a gas is preferably an inert gas that functions to prevent the photoresist pattern 100 from coming into contact with the other surrounding air during light is radiated onto the substrate 10, or a gas that may facilitate the chemical change of the photoresist pattern 100 favorable in removal thereof. Hence, the gas which is supplied around the substrate 10 during light is radiated onto the substrate 10 may be any one selected from among hydrogen ($H_2$), nitrogen ($N_2$), argon (Ar), ammonia ($NH_3$), and mixtures thereof.

Further, organic materials or impurities 300 may remain on the substrate 10 by performing a variety of processes on the substrate 10, in addition to the photoresist pattern 100. The organic materials or impurities 300 remaining on the substrate 10 may be removed together by means of irradiation of light as mentioned above. Specifically, in the course of light being radiated onto the substrate 10 so that the temperature of the substrate 10 is increased to be equal to or higher than a temperature able to remove the photoresist pattern 100 formed on the substrate 10, the organic materials or impurities 300 remaining on the substrate 10 may be removed together with the photoresist pattern 100. According to the present invention, there is no need to additionally perform a cleaning process for removing the organic materials or impurities.

Below, in order to assist understanding of the present invention, the following preferred example which is set forth to illustrate the present invention is provided, and the scope of the present invention is not limited to such an example.

The embodiments illustratively described in the present specification may be appropriately performed even without an element or elements, and a limit or limits which are not specifically disclosed herein. Thus, for example, the terms "comprising," "including," "containing" and so on should be understood as open-ended terms instead of being limited. Also, the terms and expressions used herein are used not for limitation but for explanation, and are not intended to exclude any description, illustrated features or equivalents thereof, and various modifications are possible within the scope of the claimed invention.

The present embodiments which are typically described will be more easily understood via the following example which is set forth to illustrate, but is not to be construed as limiting the present invention.

EXAMPLE

A detailed description will be given via the following embodiments, and is not to be construed as limiting the present invention under any circumferences.

Figure 3:
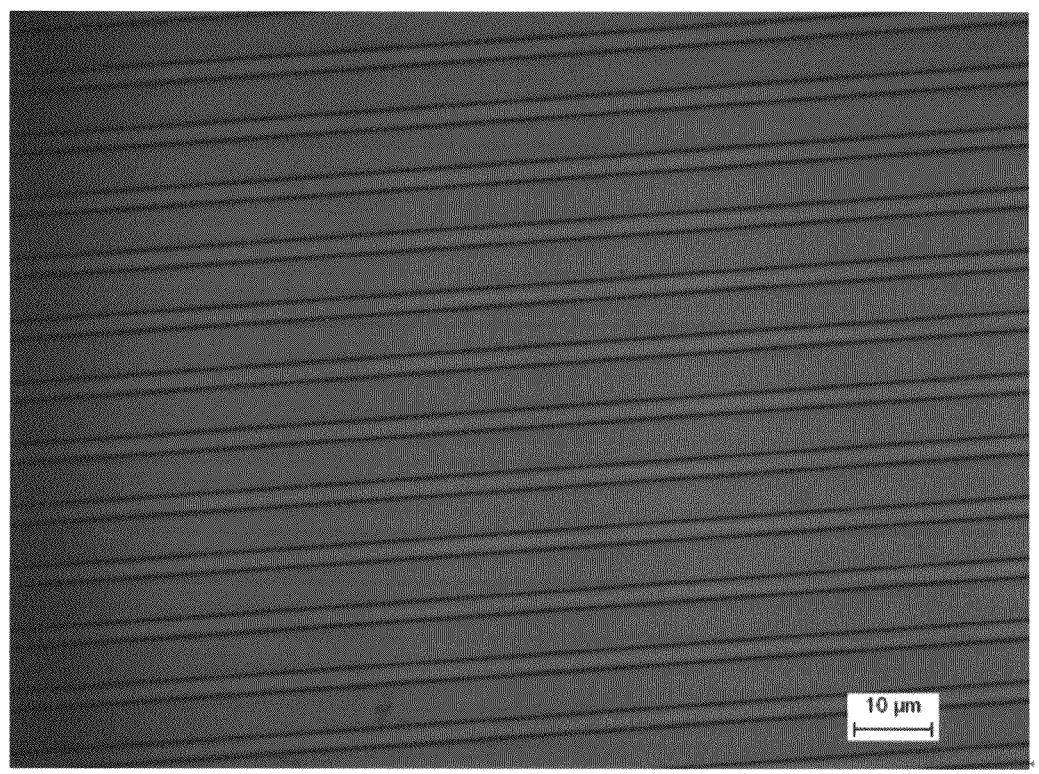
FIG. 3 is a photograph showing the upper surface of the substrate having the photoresist pattern formed thereon according to an embodiment of the present invention.

FIG. 3 is a photograph showing the upper surface of the substrate having the photoresist pattern formed thereon according to an embodiment of the present invention, and FIGS. 4 to 7 are photographs showing the upper surface of the substrate from which the photoresist pattern was removed according to an embodiment of the present invention. Whereas, FIGS. 8(a) and 8(b) and 9(a) and 9(b) are photographs showing the upper surface of the substrate from which the photoresist pattern was removed in the range falling outside the temperature of the substrate according to the present invention.

Below, with reference to FIGS. 3 to 7, 8(a) and 8(b) and 9(a) and 9(b), removing the photoresist pattern according to a preferred embodiment of the present invention is specified.

First, a sapphire substrate was prepared.

Next, a photoresist film was formed on the substrate, after which light passed through a mask for forming a fine pattern was radiated onto the photoresist so that the photoresist was selectively photo-exposed. Subsequently, the photoresist film was thermally treated at high temperature, and then developed using a developer, so that the portion of the photoresist film which was not exposed to UV light was removed. Thereby, a photoresist pattern having a size of 12 µm in a direction parallel to the cross-section of the substrate and 4 µm in a direction perpendicular thereto was formed on the substrate. FIG. 3 is a photograph showing the upper surface of the substrate having such a photoresist pattern formed thereon.

Next, the substrate having the photoresist pattern formed thereon was subjected to ion implantation for implanting dopant ions. As such, the dopant ions were implanted in a dose of $5 \times 10^{17}/cm^2$ at an energy of 67.5 Key. Accordingly, the dopant ions were implanted in the substrate and the photoresist pattern.

Next, the substrate implanted with the dopant ions was positioned in a chamber, after which light was radiated onto the substrate using a halogen heater so that the temperature of the substrate was increased to a predetermined level. Light was continuously radiated in a state in which the above increased temperature was maintained. As such, while the temperature which was increased and maintained was changed, the degree of removing the photoresist pattern was observed. The conditions in which the atmosphere around the substrate was a nitrogen atmosphere, the heating rate of the substrate was 100° C./sec and the light irradiation time was 3 min were equally set at respective temperatures.

Figure 4:
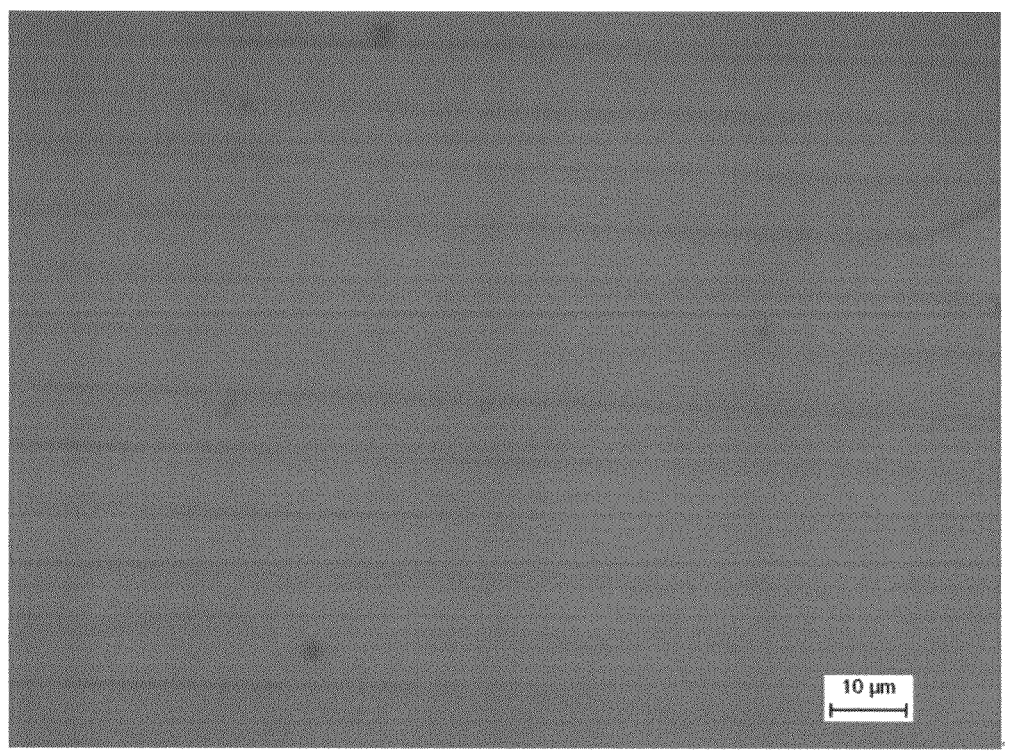
FIGS. 4 to 7 are photographs showing the upper surface of the substrate from which the photoresist pattern was removed according to an embodiment of the present invention.

FIG. 4 is a photograph showing the upper surface of the substrate after irradiation of light at a substrate temperature of 600° C. for 3 min. As shown in FIG. 4, almost all of the photoresist pattern and the impurities remaining on the substrate were removed.

Figure 5:
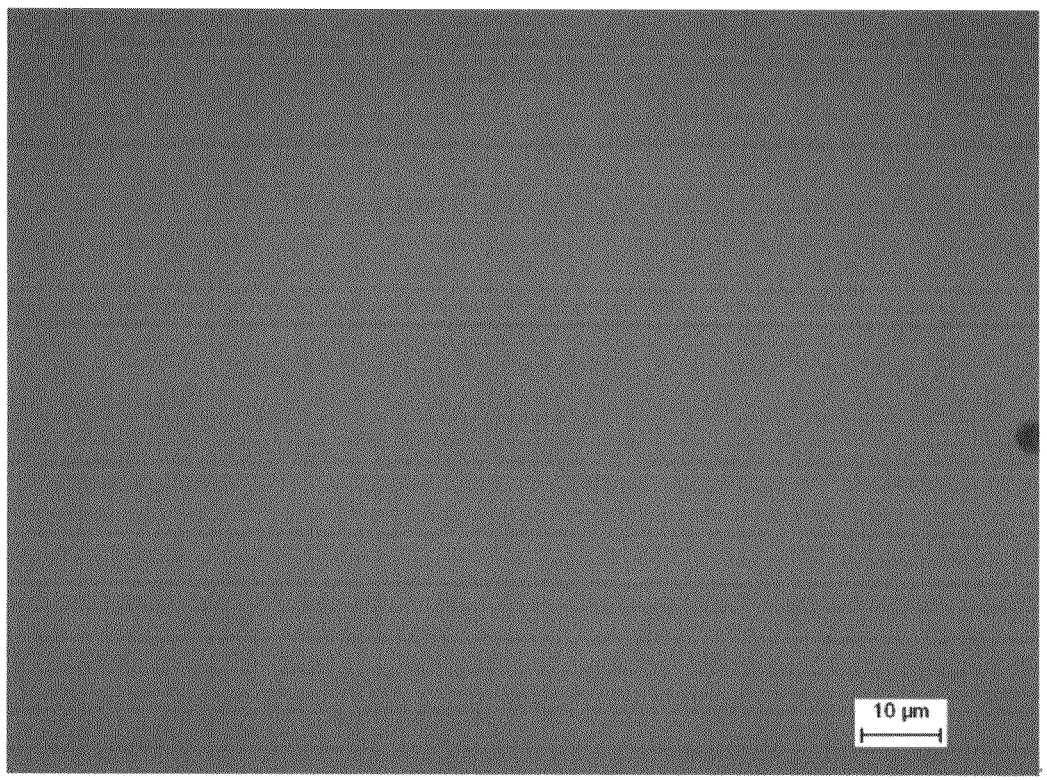
Figure 6:
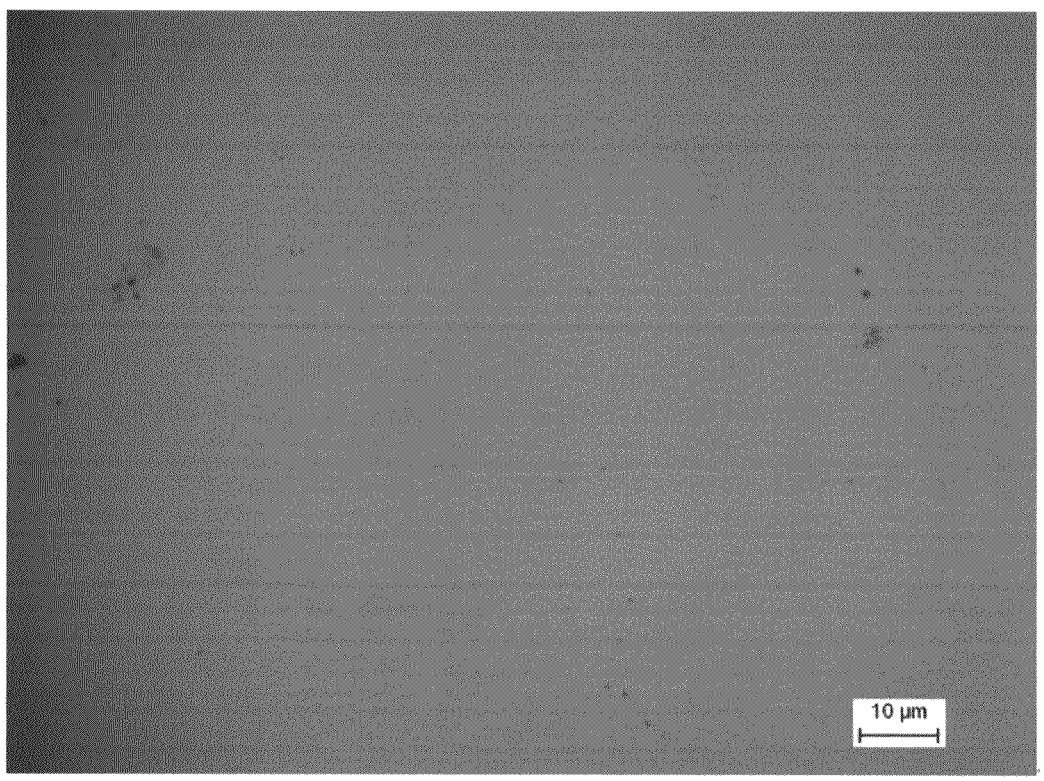
Figure 7:
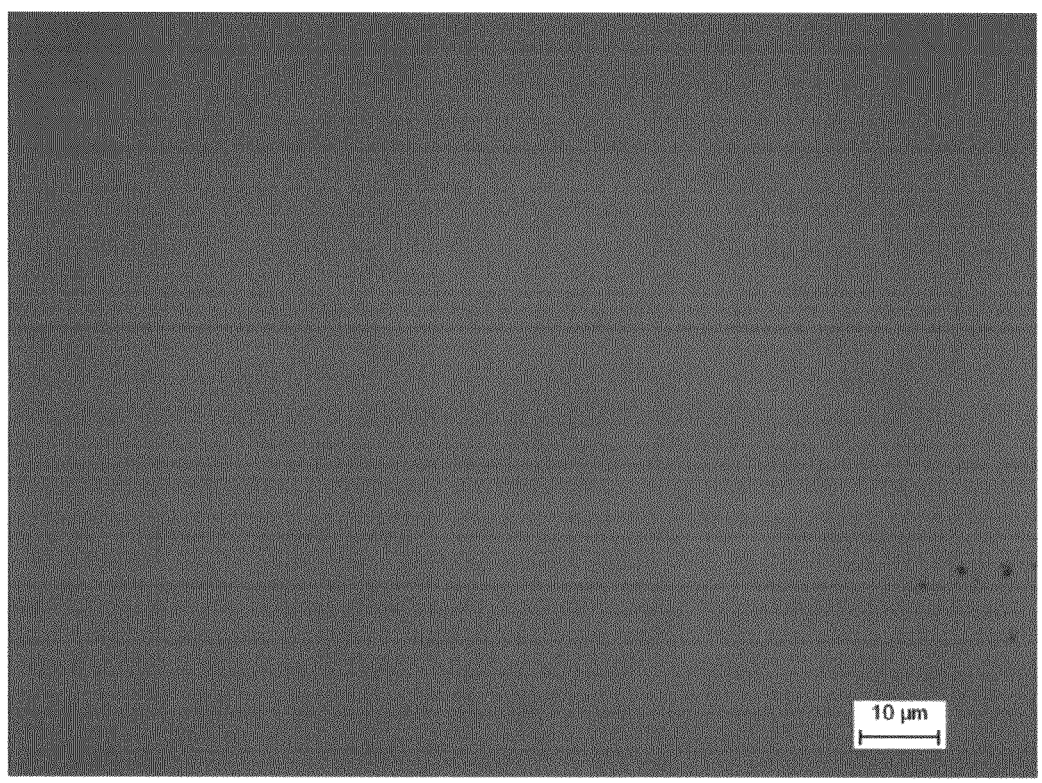

FIGS. 5 to 7 are photographs showing the upper surface of the substrate after irradiation of light at respective substrate temperatures of 700° C., 800° C. and 900° C. for 3 min. As shown in FIGS. 5 to 7, the photoresist pattern and the impurities remaining on the substrate were almost completely removed.

Figure 8:
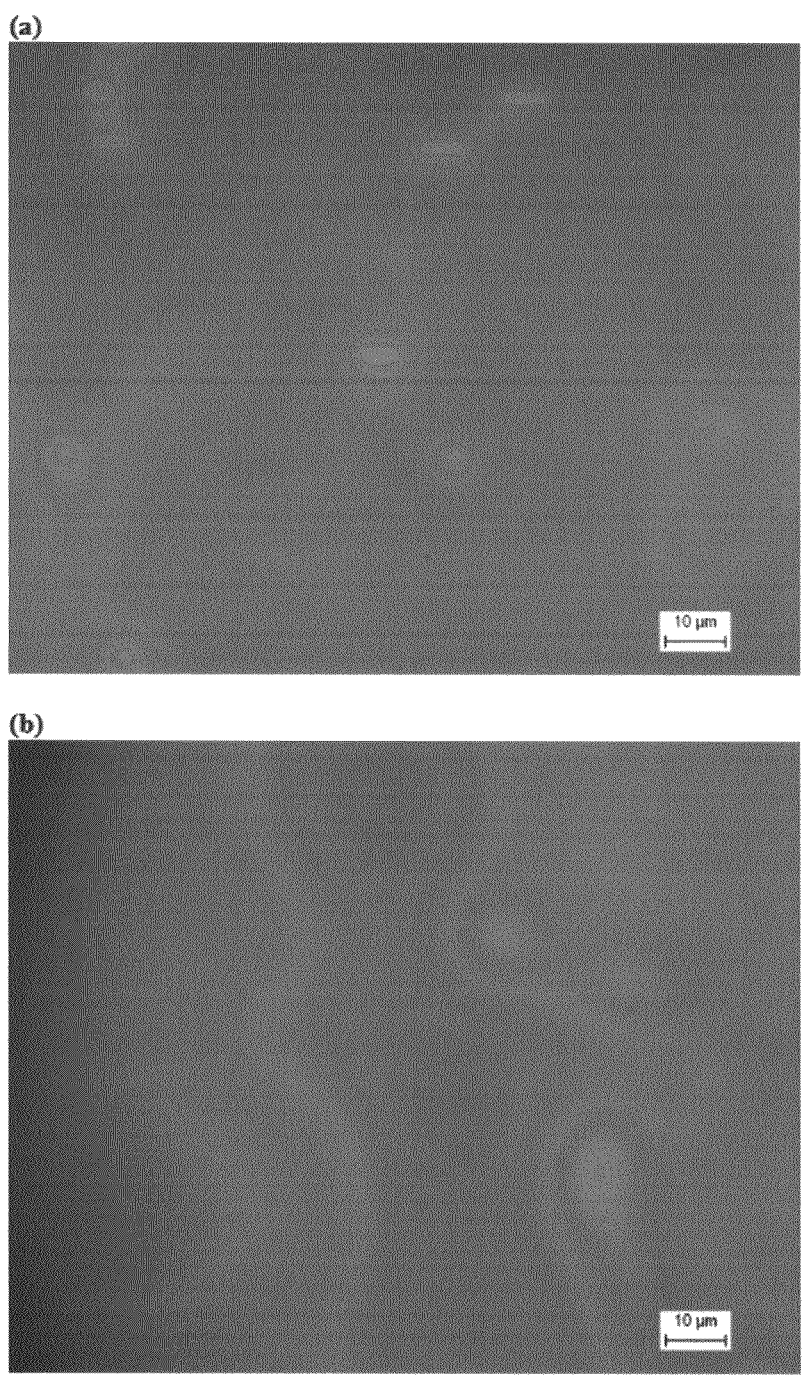
FIGS. 8(a) and 8(b) and 9(a) and 9(b) are photographs showing the upper surface of the substrate from which the photoresist pattern was removed in the range of falling outside the temperature of the substrate according to the present invention.
Figure 9:
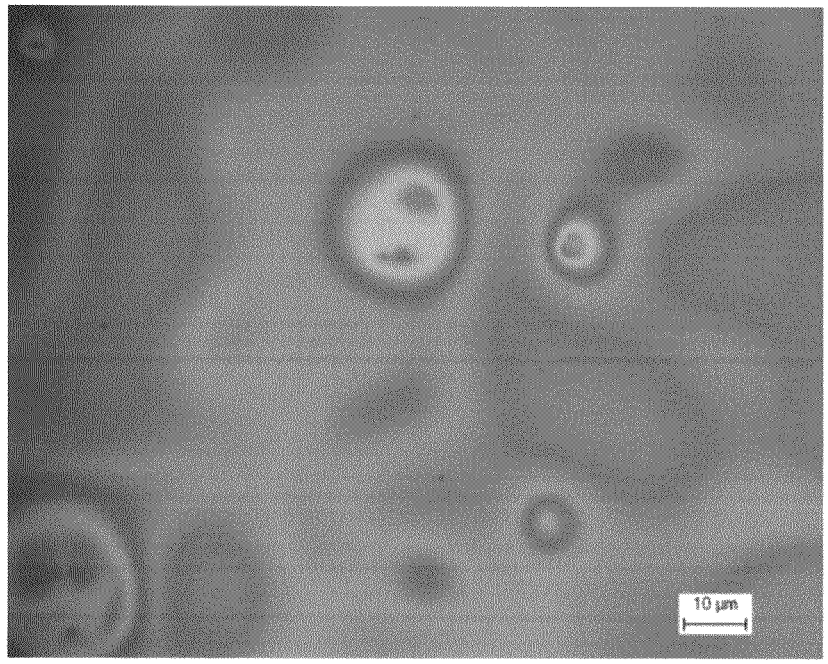
Figure 9:
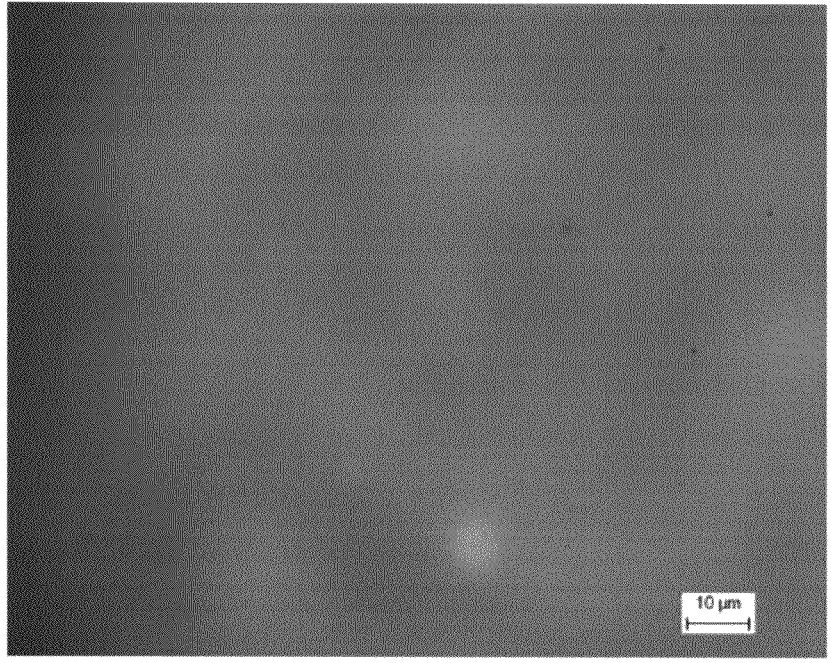

However, FIG. 8(a) is a photograph showing the upper surface of the substrate after irradiation of light for 3 min at a substrate temperature of 400° C. which falls outside the temperature range according to the present invention, and FIG. 8(b) is a photograph showing the upper surface of the substrate after irradiation of light at a substrate temperature of 400° C. for 9 min. FIG. 9(a) is a photograph showing the upper surface of the substrate after irradiation of light for 3 min at a substrate temperature of 500° C. which falls outside the temperature range according to the present invention, and FIG. 9(b) is a photograph showing the upper surface of the substrate after irradiation of light at a substrate temperature of 500° C. for 9 min. As is apparent from these drawings, when the temperature of the substrate falls outside the temperature range according to the present invention, almost none of the photoresist pattern and the impurities remaining on the substrate were removed.

Therefore, in the case where light is radiated on the substrate so that the temperature of the substrate is increased to be equal to or higher than a temperature able to remove the photoresist pattern, the photoresist pattern formed on the substrate and the impurities remaining on the substrate can be almost completely removed.

Although various aspects and embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of removing a photoresist pattern, comprising radiating light onto a substrate having a photoresist pattern formed thereon and implanted with a dopant so that a temperature of the substrate is increased to be equal to or higher than a temperature able to remove the photoresist pattern, wherein the temperature of the substrate is 550° C. to 900° C.

2. The method of claim 1, wherein the light is supplied using any one selected from the group consisting of a halogen lamp, a tungsten lamp, a quartz tube heater, and a ceramic heater.

3. The method of claim 1, wherein an atmosphere for radiating the light is a vacuum atmosphere or an atmosphere including at least one gas selected from the group consisting of hydrogen ($H_2$), nitrogen ($N_2$), argon (Ar), and ammonia ($NH_3$).

4. The method of claim 1, wherein organic materials or impurities that remain on the substrate are removed together with the photoresist pattern.

* * * * *